(12) United States Patent
Peng et al.

(10) Patent No.: US 9,559,675 B1
(45) Date of Patent: Jan. 31, 2017

(54) CURRENT SHAPING SCHEME IN TRIAC DIMMABLE LED DRIVER

(71) Applicant: Marvell International Ltd., Hamilton (BM)

(72) Inventors: Hao Peng, Sunnyvale, CA (US); Jinho Choi, Saratoga, CA (US); Wanfeng Zhang, Palo Alto, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 14/629,777

(22) Filed: Feb. 24, 2015

Related U.S. Application Data

(60) Provisional application No. 61/943,924, filed on Feb. 24, 2014.

(51) Int. Cl.
*H03K 5/08* (2006.01)
*H02M 3/335* (2006.01)
*H05B 33/08* (2006.01)

(52) U.S. Cl.
CPC ......... *H03K 5/086* (2013.01); *H02M 3/33507* (2013.01); *H05B 33/0815* (2013.01); *H05B 33/0845* (2013.01)

(58) Field of Classification Search
CPC ............ H02M 3/33507; H05B 33/0845; H05B 33/0815; H05B 37/02; H05B 33/08; H05B 41/28

USPC ..... 363/21.08, 21.12, 21.15, 21.16; 315/297, 315/300, 307, 308, 362
See application file for complete search history.

(56) References Cited

U.S. PATENT DOCUMENTS

| | | | | |
|---|---|---|---|---|
| 5,903,452 | A * | 5/1999 | Yang | ................. H02M 3/33507 363/131 |
| 7,295,176 | B2 * | 11/2007 | Yang | ................. H05B 33/0815 315/291 |
| 7,872,242 | B2 * | 1/2011 | Boswell | ................. H01J 27/024 250/396 R |
| 8,154,221 | B2 * | 4/2012 | Godbole | ............ H05B 33/0815 315/247 |
| 8,692,481 | B2 * | 4/2014 | Negrete | ............ H05B 33/0815 315/291 |
| 8,811,045 | B2 * | 8/2014 | Ren | .................... H02M 3/33507 363/21.12 |

\* cited by examiner

*Primary Examiner* — Rajnikant Patel

(57) ABSTRACT

Aspects of the disclosure provide a circuit that includes a controller. The controller is configured to receive a signal indicative of a current flowing in a magnetic component and control a switch in connection with the magnetic component to shape a peak current of the current flowing in the magnetic component. The controller shapes the peak current from a first peak current level to a second peak current level in order to reduce an amplitude of a ripple in a current drawn from a triode for alternating current (TRIAC) during a time to satisfy a holding current requirement of the TRIAC.

20 Claims, 5 Drawing Sheets

CURRENT SHAPING SCHEME IN TRIAC DIMMABLE LED DRIVER

INCORPORATION BY REFERENCE

This present disclosure claims the benefit of U.S. Provisional Application No. 61/943,924, "Current Shaping Scheme to Remove Deep Dimming Shimmering in TRIAC Dimmable LED driver" filed on Feb. 24, 2014, which is incorporated herein by reference in its entirety.

BACKGROUND

Light emitting diode (LED) lighting devices have become promising light sources for replacing conventional lighting systems, such as fluorescent and incandescent lights. In conventional triode for alternating current (TRIAC) dimmer infrastructure, TRIAC dimmable LED drivers are utilized to make LED lighting devices to be compatible with TRIAC dimmers.

SUMMARY

Aspects of the disclosure provide a circuit that includes a controller. The controller is configured to receive a signal indicative of a current flowing in a magnetic component and control a switch in connection with the magnetic component to shape a peak current of the current flowing in the magnetic component. The controller shapes the peak current from a first peak current level to a second peak current level in order to reduce an amplitude of a ripple in a current drawn from a triode for alternating current (TRIAC) during a time to satisfy a holding current requirement of the TRIAC.

In an embodiment, the second peak current level is lower than the first peak current level. In an example, the controller is configured to control the switch to shape the peak current of the current flowing in the magnetic component from the first peak current level to the second peak current level with a slope that is programmable.

According to an aspect of the disclosure, the controller is configured to change a frequency of a pulse width modulation (PWM) signal that is used to control the switch from a first PWM frequency when the peak current is at the first peak current level to a second PWM frequency when the peak current is at the second peak current level.

In an example, the second PWM frequency when the peak current is at the second peak current level is higher than the first PWM frequency when the peak current is at the first peak current level. In an example, the controller is configured to change the frequency of the PWM signal from the first PWM frequency to the second PWM frequency with a slope that is programmable.

According to an aspect of the disclosure, the circuit further includes a bleeder circuit and the controller is configured to turn on the bleeder circuit to receive energy from the magnetic component when an amount of electric energy transferred by the magnetic component exceeds a limit value.

Aspects of the disclosure provide an apparatus that includes a power converter and a control circuit. The power converter includes a magnetic component coupled with a switch. The control circuit includes a detector and a controller. The detector is configured to detect a current flowing in the magnetic component. The controller is configured to receive from the detector a signal indicative of the current flowing in the magnetic component and control the switch to shape a peak current of the current flowing in the magnetic component. The controller shapes the peak current from a first peak current level to a second peak current level in order to reduce an amplitude of a ripple in a current drawn from a TRIAC during a time to satisfy a holding current requirement of the TRIAC.

Aspects of the disclosure provide a method. The method includes receiving a signal indicative of a current flowing in a magnetic component coupled with a switch that is switched on and off to draw energy from a power source having a TRIAC, and controlling the switch based on the received signal to adjust a peak current of the current flowing in the magnetic component from a first peak current level to a second peak current level in order to reduce an amplitude of a ripple in a current drawn from a TRIAC during a time to satisfy a holding current requirement of the TRIAC.

In an embodiment, controlling the switch to adjust the peak current of the current flowing in the magnetic component from the first peak current level to the second peak current level includes determining a slope of adjusting the peak current, and controlling the switch to adjust the peak current of the current flowing in the magnetic component from the first peak current level to the second peak current level with the slope.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
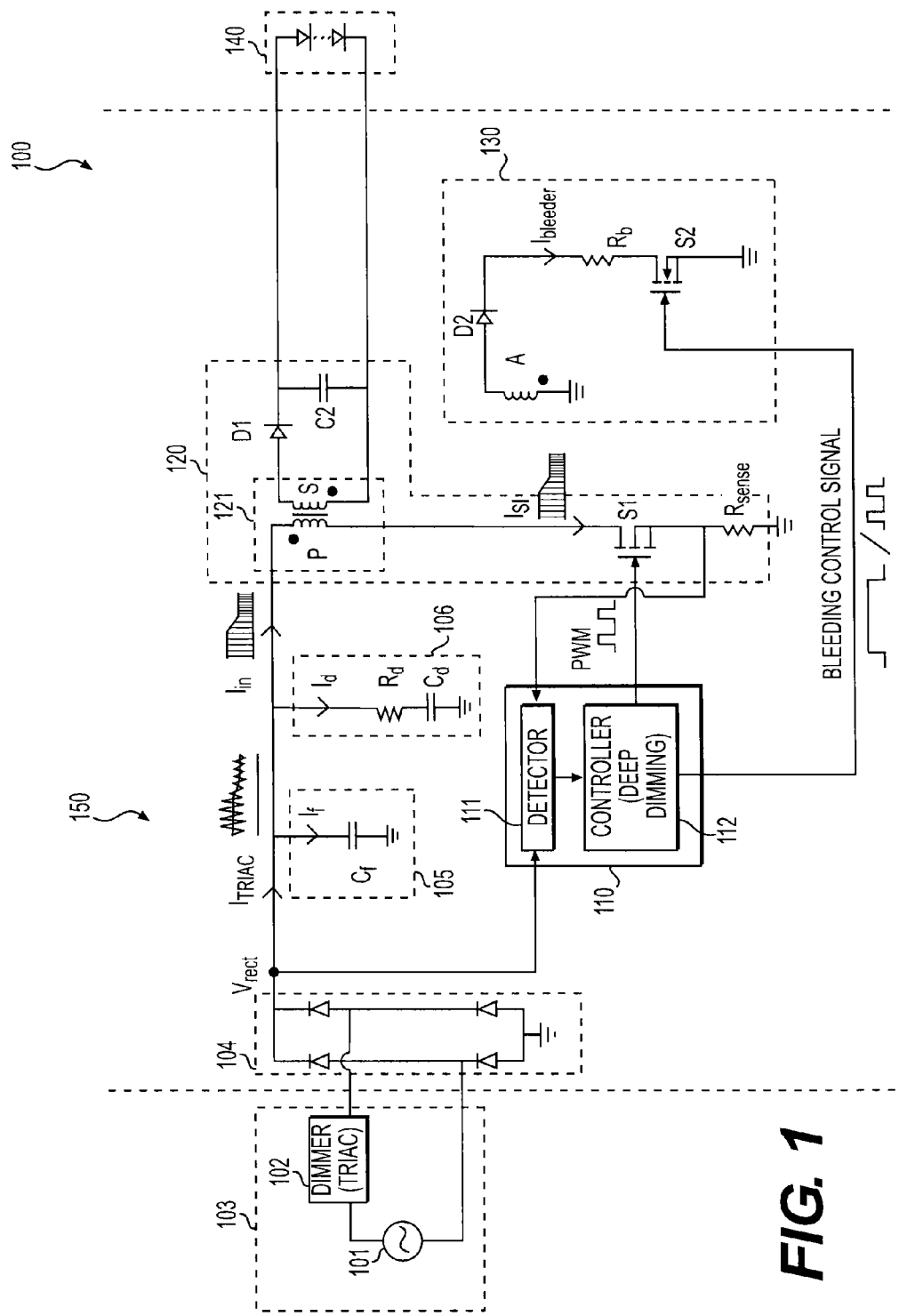
FIG. 1 shows a circuit diagram of a light emitting diode (LED) lighting system 100 according to an embodiment of the disclosure.

FIG. 1 shows a circuit diagram of a light emitting diode (LED) lighting system 100 according to an embodiment of the disclosure. The LED lighting system 100 includes an power source 103, an LED driver circuit 150, and an LED load module 140 that can include a plurality of LEDs. The power source 103 includes a dimmer 102 having a triode for alternating current (TRIAC), and the LED driver circuit 150 includes a control circuit 110. In an embodiment, the control circuit 110 is configured to control energy transfer from the power source 103 to the LED load module 140 to reduce an amplitude of a ripple in a current $I_{TRIAC}$ drawn from the TRIAC in the dimmer 102.

The power source 103 includes an alternating current (AC) power supply 101 coupled with the dimmer 102. The AC power supply 101 can be any suitable AC power supply, such as 60 Hz 120V AC power supply, 50 Hz 230V AC power supply, and the like. In an embodiment, the dimmer 102 is a phase-cut dimmer that blocks a portion of the AC signal of the AC power supply 101 to reduce the energy transferred to the LED load module 140. In an embodiment, the dimmer 102 is a TRIAC based phase-cut dimmer. The TRIAC dimmer 102 has a dimming angle. The dimming angle defines a phase-cut range in a half AC cycle. During the dimming angle, the TRIAC in the dimmer 102 is turned off and the output voltage of the dimmer 102 is about zero. Further, a phase range that is out of the phase-cut range can be referred to as a conduction angle. During the conduction angle, the TRIAC is turned on and the output voltage of the dimmer 102 is about the same as the AC voltage provided by the AC power supply 101. When the dimming angle is large, such as larger than 90% of a half AC cycle, the dimmer 102 is in a deep dimming position, and the LED lighting system is in a deep dimming condition.

Generally, to operate, the TRIAC requires different currents during different periods of the conduction angle. During a first period, the TRIAC in the dimmer 102 generally requires a latching current at a firing start to turn on. During a second period, the TRIAC can require a holding current to maintain the conduction of the TRIAC after the firing start. The latching current is a minimum current required at the firing start to turn on the TRIAC in the dimmer 102. The holding current is a minimum current required during the conduction angle after the firing start to maintain the conduction status of the TRIAC in the dimmer 102. Typically, the latching current and the holding current are in a range of 5 to 50 mA, with the latching current being larger than the holding current.

When one or both of the latching current requirement and holding current requirement are not satisfied, the dimmer 102 generally misfires and causes the LEDs in the LED load module 140 to flicker or shimmer. In an example, when the dimmer 102 is in a deep dimming position, because the power consumed by the LED load module 140 is relatively small, the current $I_{TRIAC}$ drawn from the TRIAC in the dimmer 102 during the conduction angle becomes lower than the required holding current at a certain time. As a result, the TRIAC in the dimmer 102 prematurely turns off before the conduction angle is over. When the TRIAC is prematurely turned off, the TRIAC may start firing again in the same conduction angle. Such intermittent firing by the TRIAC in the dimmer 102 causes flicking or shimmering in the LEDs in the LED load module 140.

According to an aspect of the disclosure, in a current shaping scheme, the controller 112 is suitably configured to sustain the holding current for the TRIAC to avoid flickering and shimmering and improve user experience. Specifically, in the FIG. 1 example, the LED driver circuit 150 includes a rectifier 104, a filter circuit 105, a damping circuit 106, the control circuit 110, an energy transfer module 120, and a bleeder circuit 130. These elements are coupled together as shown in FIG. 1.

The rectifier 104 rectifies the AC voltage from the dimmer 102 to a fixed polarity, such as to be positive. In the FIG. 1 example, the rectifier 104 is a bridge rectifier that provides a rectified voltage $V_{rect}$ to the following circuits, such as the energy transfer module 120. The filter circuit 105 filters the high frequency noises produced in the LED lighting system. In an embodiment, the filter circuit 105 is implemented using a filter capacitor $C_f$. The damping circuit 106 can reduce or prevent possible current strikes and current ringing caused by sudden voltage rise, such as the leading edge of the rectified voltage $V_{rect}$ when the TRIAC fires. In an embodiment, the damping circuit 106 includes a damping resistor $R_d$ and a damping capacitor $C_d$. The filter circuit 105 and the damping circuit 106 induce a filter current $I_f$ and a damping current $I_d$, respectively.

As shown in FIG. 1, the current $I_{TRIAC}$ drawn from the TRIAC in the dimmer 102 is a sum of the filter current $I_f$, the damping current $I_d$, and an input current $I_{in}$ to the energy transfer module 120. According to an aspect of the disclosure, the input current $I_{in}$ is a switching current of a relatively high frequency, such as in an order of 100 kHz. The switching current may generate ripples in the current $I_{TRIAC}$. A ripple in the current $I_{TRIAC}$ refers to small periodic variation of the current $I_{TRIAC}$ caused by variation of the input current $I_{in}$. A peak-to-peak difference (difference between the maximum and the minimum value) of the ripple is referred to as an amplitude of the ripple. The ripple may cause the TRIAC in the dimmer 102 to misfire when the LED lighting system 100 operates in a deep dimming condition. According to an aspect of the disclosure, in the current shaping scheme, the control circuit 110 is configured to shape the input current $I_{in}$ to decrease an amplitude of ripples in the current $I_{TRIAC}$ to avoid TRIAC misfiring in the deep dimming condition.

The energy transfer module 120 transfers electric energy provided by the rectified voltage $V_{RECT}$ to a plurality of circuits, such as the LED load module 140, the bleeder circuit 130, and the like. In an embodiment, the energy transfer module 120 is configured to be a switching-mode power converter. In an embodiment, the energy transfer module 120 is configured to use a magnetic component, such as an inductor, a transformer, and the like, to transfer the electric energy. The energy transfer module 120 can use a non-isolated topology, such as a buck topology, a boost topology, a buck-boost topology, and the like, or an isolated topology such as a flyback topology, and the like. In FIG. 1 example, the energy transfer module 120 adopts a flyback topology and includes a transformer 121, a switch S1, an input current sensing resistor $R_{sense}$, a diode D1 and a capacitor C2. The transformer 121 includes a primary winding (P) and a secondary winding (S). The primary winding (P) of the transformer 121, the switch S1 and the sensing resistor $R_{sense}$ are coupled together to form a switchable path. The input current $I_{in}$ of the transformer 121 flows in the switchable path and is the same as a switch current $I_{S1}$ flowing through the switch S1. The secondary winding (S) of the transformer 121 is coupled with the diode D1 and the capacitor C2. The capacitor C2 is used to receive and store electric energy transferred from the primary winding (P) to the secondary winding (S) and to drive the LED load module 140. The switch S1 can be implemented using any suitable transistor. In the FIG. 1 example, the switch S1 is implemented using an N-type metal-oxide-semiconductor field-effect transistor (MOSFET).

In an embodiment, the control circuit 110 provides a high frequency control signal, for example, a pulse width modulation (PWM) signal having a frequency in the order of 100 kHz, to a gate terminal of the switch S1 to control an energy transfer process. Specifically, when the switch S1 is turned on, the input current $I_{in}$ flows through the primary winding (P). The windings of the transformer 121 and the direction of the diode D1 are arranged such that there is no current in the secondary winding (S) of the transformer 121. Thus, the electric energy is stored in the transformer 121. When the switch S1 is turned off, the input current $I_{in}$ becomes zero, and the secondary winding (S) of the transformer 121 delivers the stored energy to the capacitor C2 and the LED load module 140. The capacitor C2 stores the energy, and the energy stored in the capacitor C2 is used to drive the LED load module 140 when the switch S1 is turned on and there is no current in the secondary winding (S).

Generally, the energy transfer module 120 operates at different energy transfer levels. An energy transfer level is used to indicate how much energy is transferred during a certain period of time, such as a half AC cycle, by the energy transfer module 120. The energy transfer level can be adjusted by adjusting properties of the PWM signal, such as a pulse width, a frequency, and the like.

The current sensing resistor $R_{sense}$ is used to provide a feedback signal for the control circuit 110 to control the switch S1. In an example, a voltage drop on the current sensing resistor $R_{sense}$ is indicative of the switching current $I_{S1}$ and is fed back to the control circuit 110 to adjust the input current $I_{in}$ to the transformer 121. Generally, the sensing resistor $R_{sense}$ has a relatively small resistance such that the voltage drop is small compared to the rectified voltage $V_{rect}$.

According to an aspect of the disclosure, the LED load module 140 consumes relatively low power in the deep dimming condition. For example, the low power is not able to sustain the holding current of the TRIAC in the dimmer 102. In an example, the control circuit 110 is configured to provide a control signal to the bleeder circuit 130 to deplete additional energy to satisfy the holding current requirement.

In the FIG. 1 example, the bleeder circuit 130 includes an auxiliary winding (A), a diode D2, a resistor $R_b$ and a switch S2 coupled together as shown in FIG. 1. The switch S2, implemented as a transistor in the FIG. 1 example, can be turned on and off under the control of a bleeding control signal from the control circuit 110. The auxiliary winding (A) is configured to be an additional secondary winding of the transformer 121. The polarity of the auxiliary winding (A) and the direction of D2 are arranged in a way similar to that of the secondary winding (S) and the diode D1 of the energy transformer module 120, and thus the bleeder circuit 130 can receive the energy that is transferred from the primary side of the transformer 121 to the auxiliary winding (A).

Specifically, in an embodiment, the control circuit 110 provides a bleeding control signal to turn on the switch S2, so that the bleeder circuit 130 is in the switch-on mode. In the switch-on mode, electronic energy is transferred from the transformer 121 to the bleeder circuit 130 when the switch S1 is turned off. In an example, the transferred electric energy is depleted by the resistor $R_b$ and converted to thermal heat. In an embodiment, the control circuit 110 turns on and off the switch S2 once in a conduction angle, for example, turns on the switch S2 at a certain time point during a conduction angle of the rectified voltage $V_{rect}$ and turns off the switch S2 in response to an end of the conduction angle. In another embodiment, the control circuit 110 turns on and off the switch S2 multiple times in a conduction angle, for example, provides a PWM signal that turns on and off the switch S2 during a period of the conduction to deplete the energy stored in the auxiliary winding (A).

The control circuit 110 includes a detector 111 and a controller 112. The detector 111 is configured to detect various parameters, such as the rectified voltage $V_{rect}$, the dimming angle of the dimmer 102, the input current $I_{in}$ of the energy transfer module 120, and the like. In an example, the detector 111 monitors the rectified voltage $V_{rect}$, detects a time duration in a half AC cycle when the TRIAC in the dimmer 102 is turned on and calculates a dimming angle. The dimming angle provides a dimming requirement for the controller 112.

The controller 112 generates various control signals based on the detected parameters to control operations in the LED lighting system 100. In an example, the controller 112 generates a pulse width modulation (PWM) signal to regulate energy transfer by the transformer 121. In an embodiment, the controller 112 uses a constant peak current control scheme to regulate the energy transfer.

According to an aspect of the disclosure, the controller 112 is in a constant current mode when the dimmer 102 exists in the power source 103. In an example, at a time, the controller 112 changes the PWM signal from "0" to "1" to turn on the switch S1. When the switch S1 is turned on, the input current $I_{in}$ of the energy transfer module 120 increases gradually. When the input current $I_{in}$ increases, the voltage drop on the current resistor $R_{sense}$ increases, and the voltage drop is provided to the detector 111 to indicate the sensed current $I_{sense}$. When the sensed current $I_{sense}$ (the voltage drop) is substantially equal to a peak current limit, the controller 112 changes the PWM signal from "1" to "0" to turn off the switch S1. At the moment the switch S1 is turned off, the input current $I_{in}$ reaches a peak current and changes to zero rapidly. In such a way, the peak current limit decides a peak current level of the input current $I_{in}$. In an embodiment, the controller 112 adjusts the peak current limit to regulate the energy transfer. In another embodiment, the controller 112 adjusts the frequency of the PWM signal to regulate the energy transfer.

According to an embodiment of the disclosure, the control circuit 110 is configured to adjust the value of the peak current limit to shape the peak current level of the input current $I_{in}$, and vary the frequency of the PWM signal to change the frequency of the input current $I_{in}$. Therefore, the peak current limit and the PWM frequency are two regulation parameters for shaping the input current $I_{in}$.

In an embodiment, the controller 112 generates a PWM signal and a bleeding control signal to control the switches S1 and S2, respectively, to satisfy the dimming requirement and the holding current requirement.

For example, when the TRIAC in the dimmer 102 is in a first dimming position with a first conduction angle, the controller 112 determines a first set of regulation parameters, such as a first peak current limit of the input current $I_{in}$, a first frequency of the PWM signal, and the like, accordingly, and controls the energy transfer module 120 to transfer energy with a first energy transfer level to the LED load module 140. In addition, the controller 112 turns off the bleeder circuit 130 to avoid additional energy depletion from the transformer 121.

When the dimmer 102 changes its dimming position, for example, to a second dimming position with a larger dimming angle than the first dimming position, the controller 102 determines a second set of input current regulation parameters accordingly and controls the energy transfer module 120 to transfer energy at a second energy transfer level that is lower than the first energy transfer level to the LED load module 140. For example, the controller 112 may choose regulation parameters to maintain a constant peak current limit but decrease the PWM frequency to reduce the energy transfer level. Alternatively, the controller 112 may choose regulation parameters to maintain the PWM frequency but decrease the peak current limit, or the controller 112 may choose regulation parameters to decrease both the PWM frequency and the peak current limit.

In the example, when the power consumption of the LED load module 140 is not able to sustain the holding current of the TRIAC in the dimmer 102, the controller 120 can choose to turn on the bleeder circuit 130 by sending the bleeding control signal to the switch S2. Thus, additional current can be drawn from the power supply 101 and the current $I_{TRIAC}$ drawn from the TRIAC in the dimmer 102 can satisfy the holding current requirement of the TRIAC.

As shown in the above example, the controller 112 changes input current regulation parameters to reduce energy transfer level and controls the bleeder circuit 130 to deplete additional energy, and, consequently, adjust the LED lighting system 100 to a deep dimming situation while maintain the TRIAC current $I_{TRIAC}$ to be above the holding current for the TRIAC in the dimmer 102.

The control circuit 110 can be implemented using discrete components, or an integrated circuit (IC). In one embodiment, the control circuit 110 is implemented using an IC and the switch S2 is included in the IC.

Figure 2:
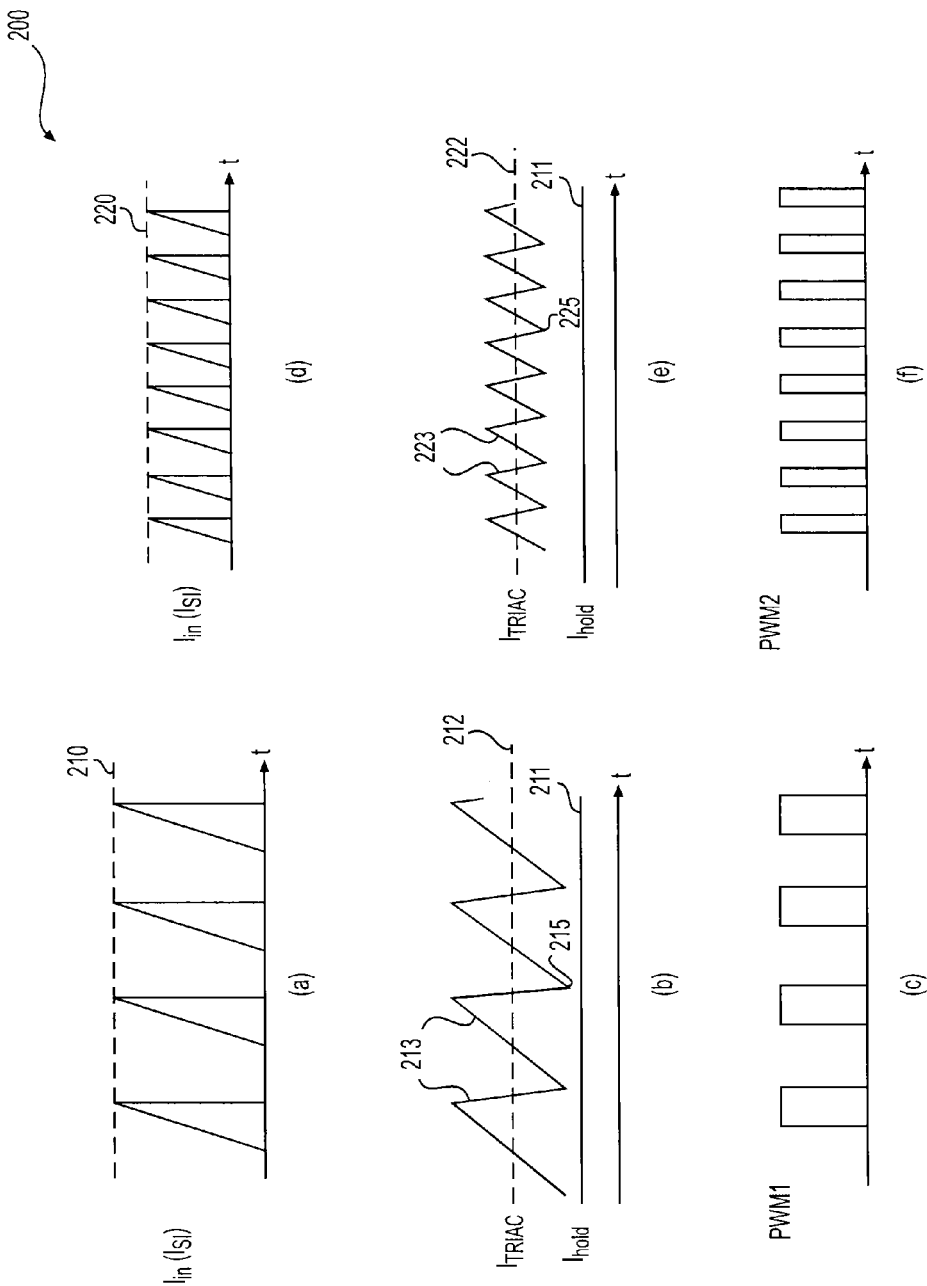
FIG. 2 shows a plot 200 of waveforms of signals in the LED lighting system 100 in FIG. 1 according to an embodiment of the disclosure.

FIG. 2 shows a plot 200 of waveforms of signals in the LED lighting system 100 in FIG. 1 according to an embodiment of the disclosure. In the embodiment, the controller 112 is in a constant peak current mode. The plot 200 illustrates the relationship between ripple amplitude of the TRIAC current $I_{TRIAC}$ and peak current of the input current $I_{in}$. The plot 200 includes a first group of waveforms (a), (b), and (c), and a second group of waveforms (d), (e), and (f). The first group of waveforms (a), (b) and (c) corresponds to a first situation when the input current $I_{in}$ is shaped at a first peak current level 210 with a first frequency, while the second group of waveforms (d), (e) and (f) corresponds to a second situation when the input current $I_{in}$ is shaped at a second peak current level 220 with a second frequency. The second peak current level is lower than the first peak current level, and the second frequency is higher than the first frequency.

As shown, waveforms (a) and (d) are two waveforms of the input current $I_{in}$ corresponding to about the same energy transfer level by the energy transfer module 120, however, these two waveforms (a) and (d) have different frequencies and peak current levels. Specifically, the waveform (a) has a lower frequency than the waveform (d), and the peak current level 210 in the waveform (a) is higher than the peak current level 220 in the waveform (d).

As shown, waveforms (b) and (e) are two waveforms of the TRIAC current $I_{TRIAC}$ corresponding to the two waveforms (a) and (d) of the input current $I_{in}$, respectively. A line 211 in both (b) and (e) represents a holding current required by the TRIAC in the dimmer 102. As shown, in waveform (b), the TRIAC current $I_{TRIAC}$ has a ripple 213 with a relatively large amplitude as a result of the relatively large peak current level 210 in waveform (a). While, in waveform (e), the TRIAC current $I_{TRIAC}$ has a ripple 223 with a relatively small amplitude as a result of the relatively small peak current level 220 in waveform (d). In addition, average current level 212 and 222 of the TRIAC currents in waveforms (b) and (e), respectively, are the same due to the same energy transfer level in the two situations. It is noted that when the dimmer 102 is in a deep dimming position, due to the low power consumption level of the LED load module 140, the average current levels 212 and 222 in waveforms (b) and (e) are low and close to the level of the holding current 211. In such a deep dimming situation, the bottom peaks 215 of the current ripple 213 in the waveform (b) is more likely to reach the level of the holding current 211 than the bottom peaks 225 of the current ripple 223 in the waveform (e). Therefore, in order to keep the TRIAC in the dimmer 102 to work in a stable status in a deep dimming situation, the TRIAC current waveform (e) with a relatively small amplitude of ripple is preferred compared to the TRIAC current waveform (b) with a relatively large amplitude of ripple.

According to an aspect of the disclosure, in a deep deeming situation, the controller 112 is configured to shape the input current $I_{in}$ from a first state with a first peak current level and a first frequency to a second state with a second peak current level and a second frequency. The second peak current level is lower than the first peak current level. As a result, the amplitude of the ripple in the current $I_{TRIAC}$ is reduced, and the TRIAC misfiring can be avoided. The current shaping scheme is described in more detail next.

As shown in FIG. 2, waveforms (c) and (f) are two PWM control signals imposed on the switch S1 in FIG. 1. Waveform (c) has a relatively wide pulse width due to the relatively high peak current level 210 in the waveform (a), while waveform (f) has a relatively narrow pulse width due to the relative low peak current level 220 in the waveform (d).

Figure 3:
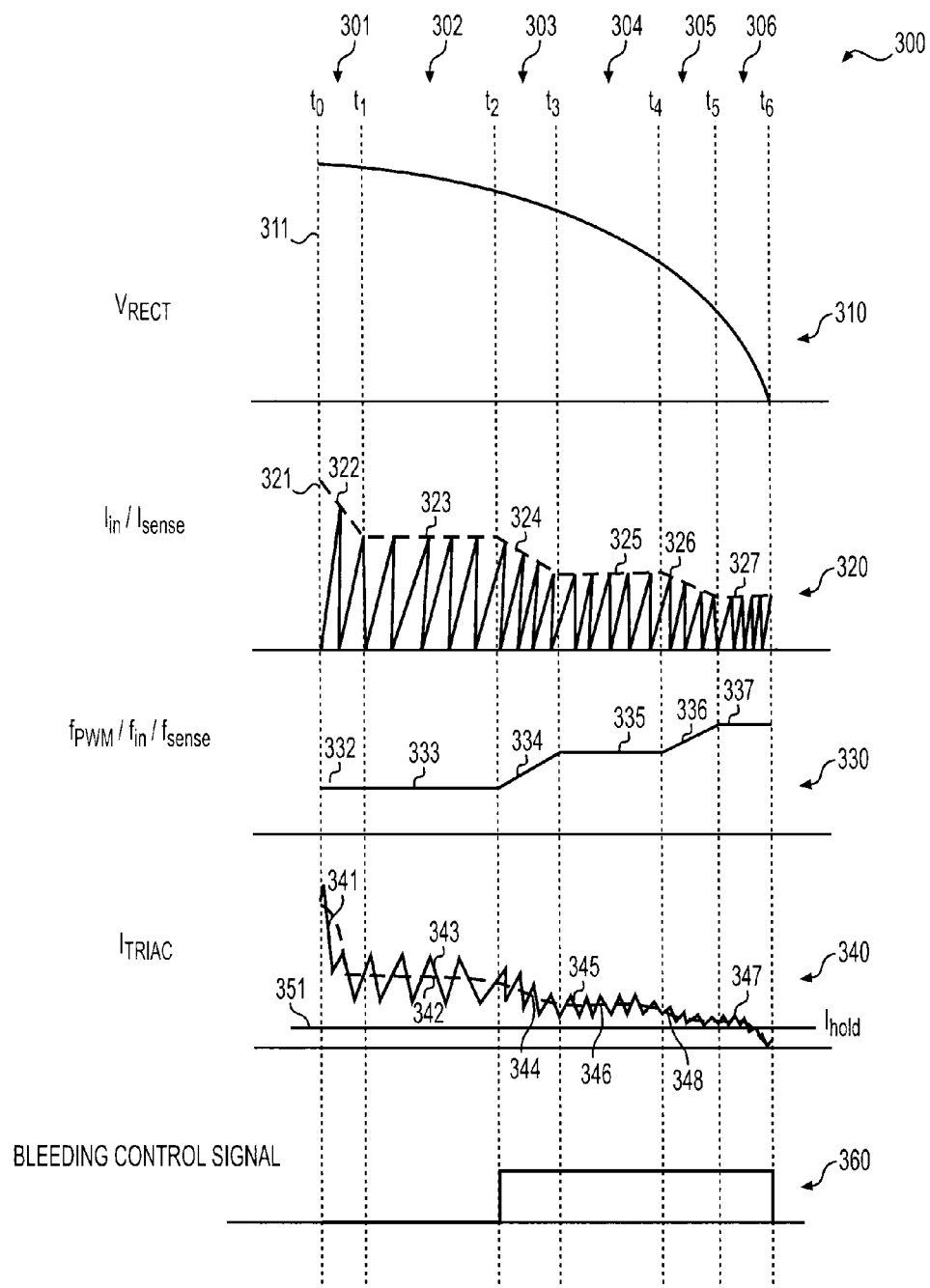
FIG. 3 shows a plot 300 of waveforms illustrating the current shaping scheme when the LED lighting system 100 operates in a deep dimming condition according to an embodiment of the disclosure.

FIG. 3 shows a plot 300 of waveforms illustrating the current shaping scheme when the LED lighting system 100 operates in a deep dimming condition according to an embodiment of the disclosure. As shown, waveform 310 represents the rectified voltage $V_{rect}$ during a conduction angle when the TRIAC in the dimmer 102 is turned on. Waveform 320 represents the input current $I_{in}$ of the energy transfer module 120 during the conduction angle. As described earlier, the sensed current $I_{sense}$ is indicated by the voltage drop on the current sensing resistor $R_{sense}$ and the voltage drop is caused by the input current $I_{in}$ of the energy transformer module 120, thus the waveform 320 also indicates the waveform of the sensed current $I_{sense}$.

In FIG. 3, waveform 330 represents a frequency $f_{PWM}$ of the PWM signal imposed on the switch S1 of the LED lighting system 100. The sensed current $I_{sense}$ and the input current $I_{in}$ have the same frequency as the PWM signal as shown by the waveform 330. Waveform 340 represents the TRIAC current $I_{TRIAC}$ drawn from the TRIAC in the dimmer 102 with a line 351 demonstrating a holding current level of the TRIAC in the dimmer 102. A last waveform 360 represents the bleeding control signal imposed on the switch S2 of the bleeder circuit 130 by the controller 112. It is noted that, for ease of showing, the frequencies of the sensed current $I_{sense}$ or input current $I_{in}$ shown in waveform 320 and the frequencies of the ripples shown in waveform 340 are illustrated much lower than they should be when compared with the duration of the rectified voltage waveform 310. In an example, the rectified voltage $V_{rect}$ recurs at a frequency of around 100 Hz, whereas the sensed current $I_{sense}$ or input current $I_{in}$ operates at a frequency in the order of 100 kHz.

As shown in FIG. 3, under the control of the control circuit 110, the input current $I_{in}$ of the energy transfer module 120 is shaped into the form of the waveform 320 to satisfy the latching current requirement and the holding current requirement of the TRIAC in the dimmer 102. Specifically, during a latching period from $t_0$ to $t_1$, the controller 112 shapes the input current $I_{in}$ to satisfy the latching current requirement; during a holding period from $t_1$ to $t_6$, the controller shapes the input current $I_{in}$ to satisfy the holding current requirement. In addition, in order to reduce an amplitude of a ripple in the input current $I_{in}$ during the holding period from $t_1$ to $t_6$ to satisfy the holding current requirement, the controller 112 reduces the peak current of the input current $I_{in}$ from a first peak current level to a second peak current level. For example, the controller 112 shapes the peak current of the input current $I_{in}$ from a peak current level 323 to a peak current level 325, or from the peak current level 325 to a peak current level 327 to reduce amplitudes of ripples in the current $I_{TRIAC}$, as shown in waveform 320. The process of the current shaping scheme is described chronologically below with reference to FIG. 3.

During the latching period from $t_0$ to $t_1$, the controller 112 shapes the input current $I_{in}$ to satisfy the latching current requirement. At time $t_0$, the dimmer 102 starts to fire and enters a conduction angle. The detector 111 detects the rise 311 of the rectified voltage $V_{rect}$ as shown in waveform 310 and triggers current shaping operation by the controller 112. In order to draw a TRIAC current $I_{TRIAC}$ larger than the required latching current of the TRIAC in the dimmer 102, the controller 112 chooses a relatively high peak current 321 and a suitable PWM frequency 332 to start its operation and imposes a respective PWM signal on the gate of the switch S1. As a result, the TRIAC in the dimmer 102 turns on reliably. Then, the controller 112 changes the peak current gradually as shown by a first slope or ramp 322.

During the holding period from time $t_1$ to time $t_6$, the controller shapes the input current $I_{in}$ to satisfy the holding current requirement.

In a time period 302 from time $t_1$ to time $t_2$, the controller 112 chooses a relatively high peak current level 323 and a relatively low PWM frequency 333 to shape the input current $I_{in}$. During the period 302, the TRIAC current $I_{TRIAC}$ has a relatively high average current level 342 and a ripple 343 with a relatively large amplitude. At time $t_2$, the bleeding control signal turns on the bleeder circuit to depletion additional energy to support deep dimming and holding current requirement.

According to an aspect of the disclosure, the energy transfer module 120 transfers energy corresponding to the dimming angle to the LED load module 140. In the deep dimming condition, the energy corresponding to the dimming angle is not enough to sustain the holding current, the controller 112 turns on the bleeder circuit 130. In an embodiment, the controller 112 keeps track of an amount of energy transferred to the LED module 140. When the amount of transferred energy during the time period 302 exceeds a limit value, the controller 112 turns on the bleeder circuit to deplete additional energy. In an embodiment, the amount of transferred energy is tracked based on the peak current level and the frequency of the input current $I_{in}$, the duration of energy transfer and the rectified voltage $V_{rect}$. In an embodiment, the limit value is determined based on the energy corresponding to the dimming angle. In an example, the limit value is a percentage, such as 70%, 80%, and the like, of the energy corresponding to the dimming angle.

In a time period 303 from time $t_2$ to time $t_3$, the LED lighting system 100 enters a first transition phase, and the controller 112 reduces the peak current of the input current $I_{in}$ from the peak current level 323 to the peak current level 325 to reduce the amplitude of the ripples in the TRIAC current $I_{TRIAC}$. During the period 303, the controller 112 reduces the peak current level gradually as shown by a second slope or ramp 324 in waveform 320 and increases the PWM frequency gradually as shown by a frequency slope or ramp 334 in waveform 330. Changing the peak current level and the PWM frequency gradually can reduce fluctuation in the TRIAC current $I_{TRIAC}$ to avoid misfiring by the TRIAC in the dimmer 102. As shown in the waveform 340, the TRIAC current $I_{TRIAC}$ changes gradually and steadily along a slope 344. In a time period from time $t_3$ to time $t_4$, the controller 112 uses peak current 325 and frequency 335 to generate the PMW signal to control the gate of switch S1. In the FIG. 3 example, the TRIAC current $I_{TRIAC}$ has a lower average current level 346 compared to the average current level 342 in the waveform 340. Thus, the TRIAC average current level 346 is closer to the TRIAC holding current level 351 compared to the average current level 342. Further, because the peak current 325 is lower than the peak current, a ripple 345 in the TRIAC current $I_{TRIAC}$ has a smaller amplitude than the ripple 343. As a result, TRIAC misfiring can be avoided and the dimmer 102 operates more reliably.

In a time period from time $t_4$ to time $t_5$, the LED lighting system 100 enters a second transition phase and the controller 112 reduces the peak current of the input current $I_{in}$ from the peak current level 325 to the peak current level 327 to reduce the amplitude of the ripples in the TRIAC current $I_{TRIAC}$. During the period 305, the controller 112 changes the peak current level gradually as shown by a third slope or ramp 326 in waveform 320 and increases the PWM frequency gradually as shown by a frequency slope 336 in waveform 330. Changing the peak current level and the PMW frequency gradually can reduce fluctuation in the TRIAC current to avoid misfiring by the TRIAC. As shown in the waveform 340, the TRIAC current $I_{TRIAC}$ changes gradually and steadily along a slope 348.

In a time period 306 from time $t_5$ to time $t_6$, the controller 112 generates the PWM signal in a manner to let the TRIAC in the dimmer 102 to turn off steadily. During the period 306, compared with the periods 302 and 304, the controller 112 chooses an even lower peak current level 327 and an even higher PWM frequency 337 to shape the input current $I_{in}$, and reduces ripple amplitude as shown by ripple 347 in FIG. 3. The TRIAC current $I_{TRIAC}$ is maintained in a stable status. As the TRIAC current gradually approaches the holding current level 351 and reduces below the holding current level 351, the TRIAC in the dimmer 102 is able to turn off steadily. In addition, the bleeding control signal changes to turn off the bleeder circuit 130 at the end of this period 306 as shown in the waveform 360.

According to an embodiment of the disclosure, the various slopes, such as the slopes of the ramps 324, 326, 334 and 336, are programmable.

In an embodiment, the controller 112 uses a comparator (not shown) to implement the ramps, such as the ramps of 322, 324 and 327, of the peak current level change. The comparator is configured to compare the feedback signal (sensed current represented as the voltage drop on the current sense resistor $R_{sense}$) with a reference voltage (peak current limit) and generate the PWM signal based on the comparison. For example, the controller 112 changes the PWM signal from "1" to "0" when the feedback signal exceeds the reference voltage. Further, the feedback signal is provided to the comparator via a delay element. The delay element is adjusted to decrease a delay. While the delay decreases gradually, the pulse width of the PWM signal decreases gradually causing the peak current level decreases gradually.

Figure 4:
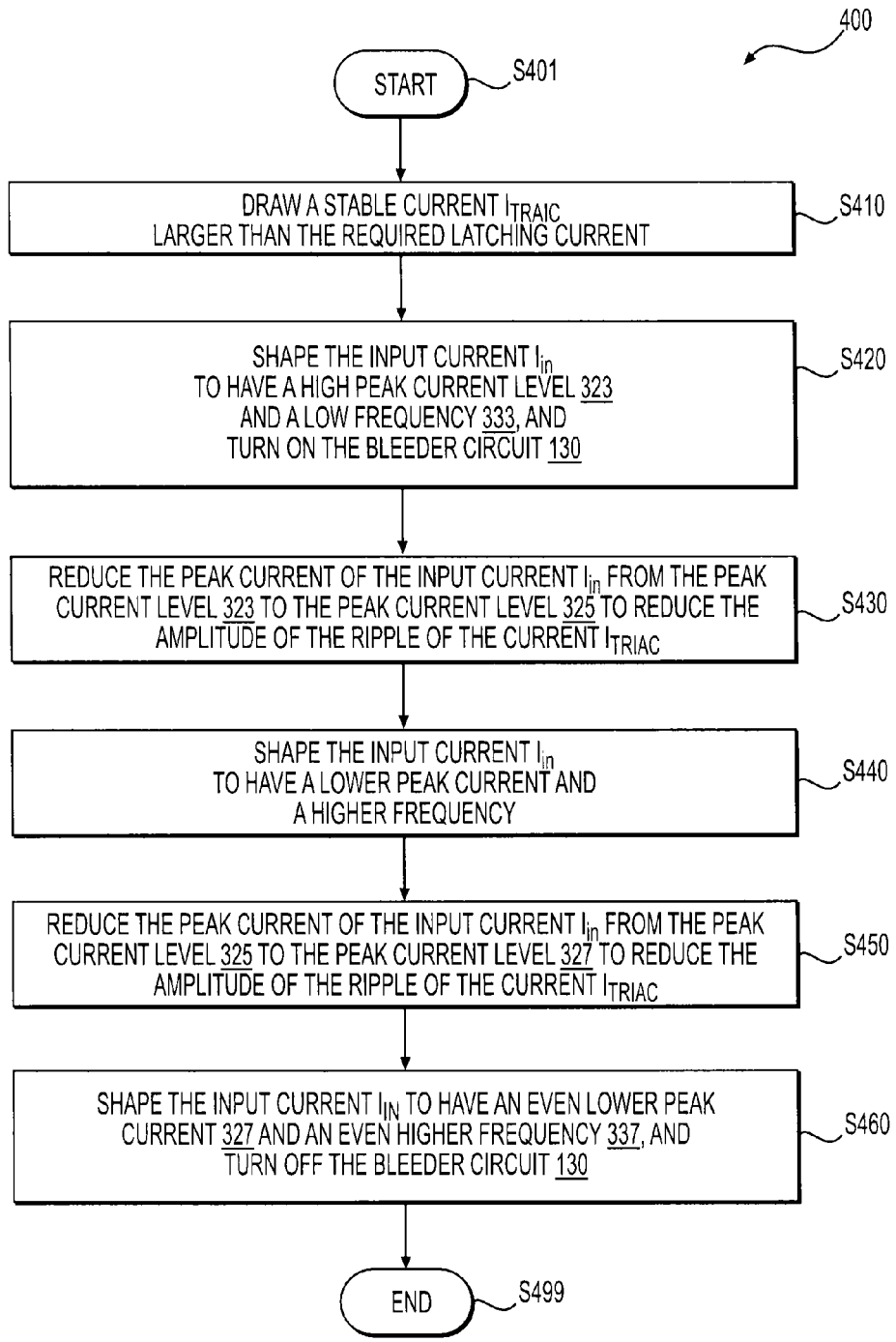
FIG. 4 shows a flowchart 400 illustrating the process of the current shaping scheme shown in FIG. 3 according to an embodiment of the disclosure.

FIG. 4 shows a flowchart 400 illustrating the process of the current shaping scheme shown in FIG. 3 according to an embodiment of the disclosure. The process starts at S401 and proceed to S410.

At S410, during the period 301, the TRIAC in the dimmer starts to fire, and the controller 112 shapes the input current $I_{in}$ to satisfy the latching current requirement. The controller 112 chooses a relatively high initial current peak 321 and a suitable PWM frequency 332 to start its operation and draws from the dimmer 102 a TRIAC current $I_{TRIAC}$ that is larger than the required latching current. After the TRIAC in the dimmer 102 turns on reliably, the controller 112 gradually decreases the peak current level of the input current $I_{in}$.

From S420 to S460, the controller shapes the input current $I_{in}$ to satisfy the holding current requirement. At S420, during the period 302, the controller 112 shapes the input current $I_{in}$ to have a relatively high peak current level 323 and a relatively low frequency 333 compared with the periods 304 and 306. The corresponding TRIAC current $I_{TRIAC}$ has a ripple with a relatively large amplitude compared with the periods 304 and 306. In addition, at the time when the transferred energy matches a limit value, the controller 112 applies a bleeding control signal to the switch S2 to turn on the bleeder circuit 130.

At S430, the LED lighting system 100 enters the first transition phase 303. The controller 112 reduces the peak current of the input current $I_{in}$ from the peak current level 323 to the peak current level 325 to reduce the amplitude of the ripple in the TRIAC current $I_{TRIAC}$. In addition, the controller 112 gradually increases the frequency of the input current $I_{in}$ from the frequency 333 to the frequency 335 to transit to the period 304.

At 5440, during the period 304, the controller 112 shapes the input current $I_{in}$ of the energy transfer module 120 to have a lower peak current and a higher frequency compared with the period 302. Thus, the TRIAC current $I_{TRIAC}$ has a ripple with a smaller amplitude compared with the period 302 and is maintained in a stable status, although the average TRIAC current 346 is closer to the level of the holding current 351 compared with the period 302.

At S450, the LED system enters the second transition phase 305. Similar to the operation at S430, the controller 112 reduces the peak current of the input current $I_{in}$ from the peak current level 325 to the peak current level 327 to reduce the amplitude of the ripple in the TRIAC current $I_{TRIAC}$. In addition, the controller 112 increases the frequency of the input current $I_{in}$ gradually from the frequency 333 to the frequency 335 to transit to the period 306.

At 460, during the period 306, the LED system 100 enters the TRIAC turning off stage. The controller 112 shapes the input current $I_{in}$ to have an even lower peak current 327 and an even higher frequency 337 compared with the periods 302 and 304. Thus, the TRIAC current $I_{TRIAC}$ has a ripple with even smaller amplitude compared with the periods 302 and 304 and is maintained in a stable status. As the TRIAC current gradually approaches the holding current level 351 and reduces below the holding current level 351, the TRIAC in the dimmer 102 is able to turn off steadily. At the end of the period 306, the controller 112 changes the bleeding control signal to turn off the bleeder circuit 130.

Figure 5:
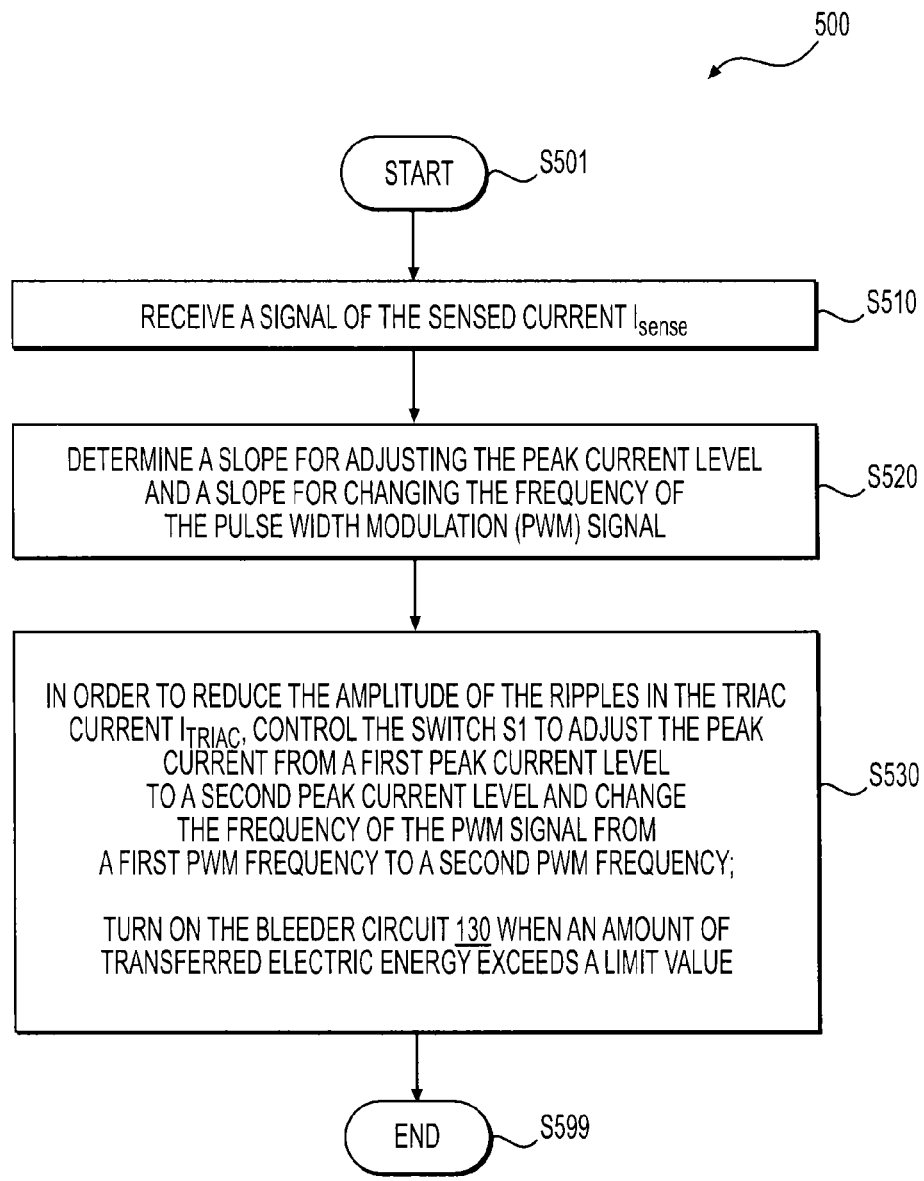
FIG. 5 shows a flowchart 500 of a current shaping process in the LED lighting system 100 according to an embodiment of the disclosure.

FIG. 5 shows a flowchart 500 of a current shaping process in the LED lighting system 100 according to an embodiment of the disclosure. The current shaping process is carried out during a time to satisfy the holding current requirement of the TRIAC in the dimmer 102 when the LED lighting system 100 is in a deep dimming condition. The process starts at S501 and proceeds to S510.

At S510, the detector 111 detects the voltage drop on the current sense resistor $R_{sense}$. The voltage drop is indicative of the sensed current $I_{sense}$.

At S520, the controller 112 determines a slope for adjusting the peak current level of the input current $I_{in}$. In addition, the controller 112 also determines a slope for changing the frequency of the PWM signal.

At S530, in order to reduce the amplitude of the ripples in the TRIAC current $I_{TRIAC}$, the controller 112 controls the switch S1 to adjust the peak current of the input current $I_{in}$ from a first peak current level to a second peak current level, and changes the frequency of the PWM signal from a first PWM frequency when the peak current is at the first peak current level to a second PWM frequency when the peak current is at the second peak current level.

Still at S530, in an embodiment, the second peak current level is lower than the first peak current level, and the second PWM frequency is higher than the first PWM frequency. Thus, amplitude of a ripple in the TRIAC current $I_{TRIAC}$ is reduced during this process.

Still at S530, in an embodiment, when an amount of transferred electric energy exceeds a limit value, the controller 112 turns on the bleeder circuit 130 by sending a bleeding signal to the switch S2.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A power converter circuit, comprising:
a controller configured to,
receive a signal indicative of a current flowing in a magnetic component coupled with a switch that is switched on and off to draw energy from a power source having a dimmer including a triode for alternating current (TRIAC),
control the switch based on the received signal to turn the power converter circuit into a deep dimming condition when the dimmer is in a deep dimming position, and
during each conduction angel of the TRIAC when the power converter circuit is in the deep dimming condition, control the switch based on the received signal to shape a peak current of the current flowing in the magnetic component from a first peak current level to a second peak current level in order to reduce an amplitude of a ripple in a current drawn from the TRIAC to sustain a holding current for the TRIAC.

2. The circuit of claim 1, wherein the controller is configured to control the switch to shape the peak current of the current flowing in the magnetic component from the first peak current level to the second peak current level such that the current drawn from the TRIAC in the dimmer corresponding to the second peak current level is maintained larger than the holding current required to sustain conduction of the TRIAC in the dimmer.

3. The circuit of claim 1, wherein the controller is configured to control the switch to shape the peak current of the current flowing in the magnetic component from the first peak current level to the second peak current level with a slope that is programmable.

4. The circuit of claim 1, wherein the controller is configured to change a frequency of a pulse width modulation (PWM) signal that is used to control the switch from a first PWM frequency when the peak current is at the first peak current level to a second PWM frequency when the peak current is at the second peak current level.

5. The circuit of claim 4, wherein the second PWM frequency when the peak current is at the second peak current level is higher than the first PWM frequency when the peak current is at the first peak current level.

6. The circuit of claim 4, wherein the controller is configured to change the frequency of the PWM signal that is used to control the switch from the first PWM frequency when the peak current is at the first peak current level to the second PWM frequency when the peak current is at the second peak current level with a slope that is programmable.

7. The circuit of claim 1, wherein the controller is configured to turn on a bleeder circuit to deplete energy from the magnetic component when an amount of electric energy transferred by the magnetic component exceeds a preconfigured limit value.

8. A power converter circuit, comprising:
an energy transfer module including a magnetic component and a switch coupled with the magnetic component, the switch being switched on and off to draw energy from a power source having a dimmer including a triode for alternating current (TRIAC); and
a control circuit including:
a detector configured to detect a current flowing in the magnetic component; and
a controller configured to,
receive from the detector a signal indicative of the current flowing in the magnetic component,
control the switch based on the received signal to turn the power converter circuit into a deep dimming condition when the dimmer is in a deep dimming position, and
during each conduction angel of the TRIAC when the power converter circuit is in the deep dimming condition, control the switch based on the received signal to shape a peak current of the current flowing in the magnetic component from a first peak current level to a second peak current level in order to reduce an amplitude of a ripple in a current drawn from the TRIAC to sustain a holding current for the TRIAC.

9. The power converter circuit of claim 8, wherein the controller is configured to control the switch to shape the peak current of the current flowing in the magnetic component from the first peak current level to the second peak current level such that the current drawn from the TRIAC in the dimmer corresponding to the second peak current level is maintained larger than the holding current required to sustain conduction of the TRIAC in the dimmer.

10. The power converter circuit of claim 8, wherein the controller is configured to control the switch to shape the peak current of the current flowing in the magnetic component from the first peak current level to the second peak current level with a slope that is programmable.

11. The power converter circuit of claim 8, wherein the controller is configured to change a frequency of a pulse width modulation (PWM) signal that is used to control the switch from a first PWM frequency when the peak current is at the first peak current level to a second PWM frequency when the peak current is at the second peak current level.

12. The power converter circuit of claim 11, wherein the controller is configured to change the frequency of the PWM signal that is used to control the switch from the first PWM frequency when the peak current is at the first peak current level to the second PWM frequency when the peak current is at the second peak current level with a slope that is programmable.

13. The power converter circuit of claim 8, further comprising a bleeder circuit controlled by the controller, wherein the controller is configured to turn on the bleeder circuit to deplete energy from the magnetic component when an amount of electric energy transferred by the magnetic component exceeds a preconfigured limit value.

14. A method, comprising:
receiving a signal indicative of a current flowing in a magnetic component coupled with a switch that is switched on and off to draw energy from a power source having a dimmer including a triode for alternating current (TRIAC);
controlling the switch based on the received signal to turn the power converter circuit into a deep dimming condition when the dimmer is in a deep dimming position; and
during each conduction angel of the TRIAC when the power converter circuit is in the deep dimming condition, controlling the switch based on the received signal to adjust a peak current of the current flowing in the magnetic component from a first peak current level to a second peak current level in order to reduce an amplitude of a ripple in a current drawn from the TRIAC to sustain a holding current for the TRIAC.

15. The method of claim 14, wherein controlling the switch based on the received signal to adjust the peak current of the current flowing in the magnetic component from the first peak current level to the second peak current level further comprises:
controlling the switch to adjust the peak current of the current flowing in the magnetic component from the first peak current level to the second peak current level such that the current drawn from the TRIAC in the dimmer corresponding to the second peak current level is maintained larger than the holding current required to sustain conduction of the TRIAC in the dimmer.

16. The method of claim 14, wherein controlling the switch to adjust the peak current of the current flowing in the magnetic component from the first peak current level to the second peak current level includes:
determining a slope for adjusting the peak current of the current flowing in the magnetic component from the first peak current level to the second peak current level; and
controlling the switch to adjust the peak current of the current flowing in the magnetic component from the first peak current level to the second peak current level with the slope.

17. The method of claim 14, wherein controlling the switch to adjust the peak current of the current flowing in the magnetic component from the first peak current level to the second peak current level further comprises:
changing a frequency of a pulse width modulation (PWM) signal that is used to control the switch from a first PWM frequency when the peak current is at the first peak current level to a second PWM frequency when the peak current is at the second peak current level.

18. The method of claim 17, wherein the second PWM frequency when the peak current is at the second peak current level is higher than the first PWM frequency when the peak current is at the first peak current level.

19. The method of claim 17, wherein changing the frequency of the PWM signal from the first PWM frequency when the peak current is at the first peak current level to the second PWM frequency when the peak current is at the second peak current level comprises:
determining a slope for changing the frequency of the PWM signal from the first PWM frequency when the peak current is at the first peak current level to the second PWM frequency when the peak current is at the second peak current level; and
changing the frequency of the PWM signal from the first PWM frequency when the peak current is at the first peak current level to the second PWM frequency when the peak current is at the second peak current level with the slope.

20. The method of claim 14, further comprising:
turning on a bleeder circuit to deplete energy from the magnetic component when an amount of electric energy transferred by the magnetic component exceeds a preconfigured limit value.

* * * * *